(12) United States Patent
Bucur (10) Patent No.: US 11,320,319 B2
(45) Date of Patent: May 3, 2022

(54) CIRCUIT FOR GENERATING A TEMPERATURE DEPENDENT OUTPUT

(71) Applicant: Analog Devices International Unlimited Company, Limerick (IE)

(72) Inventor: Viorel Bucur, Cahercolnish (IE)

(73) Assignee: Analog Devices International Unlimited Company, Limerick (IE)

( * ) Notice: Subject to any disclaimer, the term of this patent is extended or adjusted under 35 U.S.C. 154(b) by 190 days.

(21) Appl. No.: 16/706,422

(22) Filed: Dec. 6, 2019

(65) Prior Publication Data

US 2021/0172807 A1    Jun. 10, 2021

(51) Int. Cl.
*G05F 3/20* (2006.01)
*G01K 7/01* (2006.01)
(Continued)

(52) U.S. Cl.
CPC ............ *G01K 7/01* (2013.01); *G05F 3/02* (2013.01); *G05F 3/205* (2013.01); *G05F 3/22* (2013.01); *G05F 3/225* (2013.01); *H03K 17/14* (2013.01)

(58) Field of Classification Search
CPC ........ G05F 3/245; G05F 3/22–30; G05F 3/10; G05F 3/16; G05F 3/18; G05F 3/185; G05F 3/20; G05F 3/26; G05F 3/205; G05F 3/24; G05F 3/222; G05F 3/242; G05F 3/225; G05F 3/227; G05F 3/247; G05F 3/262; G05F 3/265; G05F 3/267; G05F 1/463;
(Continued)

(56) References Cited

U.S. PATENT DOCUMENTS

| | | | |
|---|---|---|---|
| 8,531,169 B2 * | 9/2013 | Marinca | G05F 3/30 323/311 |
| 10,890,935 B2 * | 1/2021 | Mouret | G05F 3/267 |
| 2019/0113946 A1 * | 4/2019 | Nicollini | G05F 3/265 |

OTHER PUBLICATIONS

Bucur, Viorel, "Reducing the Bipolar Junction Transistor Base-Emitter Voltage Non-Linearity", 26th Annual Conference on Mixed Design of Integrated Circuits and Systems (MIXDES), Rzeszow, Poland, (Jun. 2019), 6 pgs.
(Continued)

*Primary Examiner* — Thienvu V Tran
*Assistant Examiner* — Nusrat Quddus
(74) *Attorney, Agent, or Firm* — Schwegman Lundberg & Woessner, P.A.

(57) ABSTRACT

The present disclosure provides a circuit for generating a complimentary to absolute temperature (CTAT) voltage reference. The primary contributor to the voltage reference is first bipolar junction transistor, which is configured in diode mode, to produce the CTAT voltage. Such references include a non-linear component. A pair of bipolar junction transistors are coupled to the first bipolar junction transistor, and are configured to generate a delta base-emitter voltage. By coupling one of the pair to a proportional to absolute temperature current source, and the other to a current course which is substantially independent of absolute temperature, a further non-linear component is introduced, which is complimentary to the non-linear component introduced by the first bipolar junction transistor. The pair of bipolar transistors share a common emitter area size. As such, the non-linear component of the first bipolar junction transistor is compensated by the delta base-emitter arrangement, resulting in a more linear output.

18 Claims, 9 Drawing Sheets

(51) Int. Cl.
*H03K 17/14* (2006.01)
*G05F 3/02* (2006.01)
*G05F 3/22* (2006.01)

(58) Field of Classification Search
CPC . G05F 1/468; G05F 1/46; G05F 1/461; G05F 1/575; G05F 1/465
See application file for complete search history.

(56) References Cited

OTHER PUBLICATIONS

Johnson, DA, "Analog Integrated Circuit Design, pp. 146-147", John Wiley and Sons, (1997), 2 pgs.
Pertijs, Micheal AP, "Precision Temperature Sensors in CMOS Technology, pp. 21-23", Springer Science and Business Media, (2006), 3 pgs.
Tsividis, Yannis, "Accurate Analysis of Temperature Effects in IC-VBE Characteristics with Application to Bandgap Reference Sources", IEEE Journal of Solid-State Circuits, SC-15(6), (Dec. 1980), 1076-1084.
Widlar, Robert J, "New Developments in IC Voltage Regulators", IEEE Journal of Solid-State Circuits, SC-6(1), (Feb. 1971), 2-7.

\* cited by examiner

CIRCUIT FOR GENERATING A TEMPERATURE DEPENDENT OUTPUT

FIELD OF THE DISCLOSURE

The present disclosure provides a circuit for generating temperature dependent output. In particular, the disclosure provides a circuit which compensates for non-linearity in the output.

BACKGROUND

There is an increasing demand for high-performance, low-cost, small footprint and reliable silicon-based temperature sensors. Most high precision temperature sensors are based on Bipolar Junction Transistor (BJT). The base-emitter voltage of a BJT can act as a good temperature sensor. However, as is well known in the art, such devices suffer from base-emitter voltage variation and inherent non-linearity.

The base-emitter voltage, $V_{be}$ (T), temperature dependency is known from the art, and is shown in Equation (1):

$$V_{be}(T) = V_{G0} - \frac{T}{T_0}[V_{G0} - V_{be0}] - XTI\frac{kT}{q}\left[\ln\left(\frac{T}{T_0}\right)\right] + \frac{kT}{q}\ln\left(\frac{I_c}{I_{c0}}\right) \quad (1)$$

where $V_{G0}$ is the extrapolated bandgap voltage at T=0K, $V_{be0}$ is the base-emitter voltage at temperature $T_0$, and XTI is the saturation current temperature exponent. This equation can be separated into three terms: constant ($V_{G0}$), $$\text{linear}\left(\frac{T}{T_0}[V_{G0} - V_{be0}]\right),$$

$$\text{and non-linear}\left(XTI\frac{kT}{q}\left[\ln\left(\frac{T}{T_0}\right)\right] + \frac{kT}{q}\ln\left(\frac{I_c}{I_{c0}}\right)\right),$$

from the point of view of temperature dependency. From Equation (1), $V_{be}$ (T) can be expressed as:

$$V_{be}(T) = \text{Constant} + \alpha T + \beta_{nonlin}(T) \quad (2)$$

It can be seen from Equation (1) that the base-emitter voltage nonlinearity with temperature is:

$$nonlin\{V_{BE}(T)\} = XTI\frac{kT}{q}\left[\ln\left(\frac{T}{T_0}\right)\right] + \frac{kT}{q}\ln\left(\frac{I_c}{I_{c0}}\right) \quad (3)$$

From Equation (3) we can state that $V_{be}$ (T) nonlinearity has two components. Firstly, it has a device-related dependency through parameter XTI. Secondly, it has a bias-dependency through the temperature variation of the collector current.

SUMMARY OF THE DISCLOSURE

The present disclosure provides a circuit for generating a complimentary to absolute temperature (CTAT) voltage reference. The primary contributor to the voltage reference is first bipolar junction transistor, which is configured in diode mode, to produce the CTAT voltage. Such references include a non-linear component. A pair of bipolar junction transistors are coupled to the first bipolar junction transistor, and are configured to generate a delta base-emitter voltage. By coupling one of the pair to a proportional to absolute temperature current source, and the other to a current course which is substantially independent of absolute temperature, a further non-linear component is introduced, which is complimentary to the non-linear component introduced by the first bipolar junction transistor. The pair of bipolar transistors share a common emitter area size. As such, the non-linear component of the first bipolar junction transistor is compensated by the delta base-emitter arrangement, resulting in a more linear output.

In a first aspect, the present disclosure provides a circuit for producing a reference output, comprising: a reference generation module, configured to produce a first reference output having a first temperature dependent non-linear component; and a non-linearity compensation module, configured to generate a second reference output having a second temperature dependent non-linear component; wherein the reference generation module and the non-linearity compensation modules are coupled together such that the first and second reference outputs generate the circuit reference output, and such that the second temperature dependent non-linear component at least partially compensates for the first non-linear component.

In a second aspect, the present disclosure provides a circuit for producing a reference output, comprising: the circuit of the first aspect; one or more additional non-linearity compensation modules, configured to generate one or more further reference outputs having one or more additional temperature dependent non-linear components; wherein the one or more additional non-linearity compensation modules are coupled to the circuit of the first aspect such that the first, second and one or more further reference outputs generate the circuit reference output, and such that the second temperature dependent non-linear component and the one or more additional temperature dependent non-linear components at least partially compensates for the first non-linear component.

In a third aspect, the present disclosure provides a circuit for producing an output which is complimentary to absolute temperature, the circuit comprising: a base-emitter voltage generator, configured to generate a voltage which complimentary to absolute temperature, $V_{CTAT}$, and which include a first non-linear component; one or more delta base-emitter voltage generator cells, coupled to the base-emitter voltage generator, and arranged to compensate for the first non-linear component, each cell configured to generate a delta base-emitter voltage having a further non-linear component.

In a fourth aspect, the present disclosure provides a method of compensating for non-linearity in a temperature dependent voltage reference, the method comprising: generating a first temperature dependent voltage reference having a first non-linear component; generating one or more further voltage references, each having a further non-linear component; combining the first temperature dependent voltage reference with the one or more further voltage references in order to produce a temperature dependent output voltage reference in which the first non-linear component is at least partially compensated.

In a fifth aspect, the present disclosure provides a circuit for producing an output which is complimentary to absolute temperature, the circuit comprising: a first bipolar transistor configured to generate a first base-emitter voltage (Vbe) which is complimentary to absolute temperature, the base-emitter voltage having a first non-linear component; and a pair of bipolar transistors, comprising a second bipolar transistor and a third bipolar transistor, configured to generate an output which is a difference between the base-emitter voltages (ΔVbe) of each of the bipolar transistors of the pair, ΔVbe having a second non-linear component; wherein: the second bipolar transistor being biased by a proportional to absolute temperature current source; the third bipolar transistor being biased by a current source which is substantially independent of absolute temperature; and the output of the circuit is the first Vbe minus ΔVbe, and has a reduced non-linearity.

In a sixth aspect, the present disclosure provides a circuit for producing a temperature dependent output, the circuit comprising: a first module having one or more bipolar transistors arranged to produce a first output having a first non-linear component; a second module having: at least two bipolar transistors arranged to produce a second output; at least two current sources, arranged to bias the at least two bipolar transistors, wherein the current sources generate currents with different temperature dependencies, such that the second output has a second non-linear component; wherein, the second module is coupled to the first module to generate a circuit output, the circuit output having non-linearity which is less than the first non-linearity.

Further features and aspects of the present disclosure are explained below and defined in the appended claims.

BRIEF DESCRIPTION OF THE DRAWINGS

The present disclosure will now be described in more detail, by way of example and with reference to the accompanying drawings, in which.

DETAILED DESCRIPTION OF EMBODIMENTS

It is known that the voltage ($V_{be}$) dropped across the base-emitter junction of a bipolar junction transistor (BJT) reduces with temperature, and can therefore be used as a temperature sensor. Such a relationship is known as complimentary to absolute temperature, or CTAT. It is also known that $V_{be}$ has a non-linear component, which can result in inaccurate readings. The present disclosure proposes to compensate for this non-linear component by using a delta $V_{be}$ ($\Delta V_{be}$) circuit to introduce a non-linear component of opposite polarity.

This is achieved by using a pair of BJTs, with their base-emitter junctions configured to subtract one $V_{be}$ from the other. Ordinarily $\Delta V_{be}$ is linear. However, the inventor has appreciated that by biasing each of the pair of BJTs with currents having different temperature dependencies, a non-linearity can be introduced. By subtracting this non-linearity from that of the first BJT, a more linear output can be produced.

Figure 1:
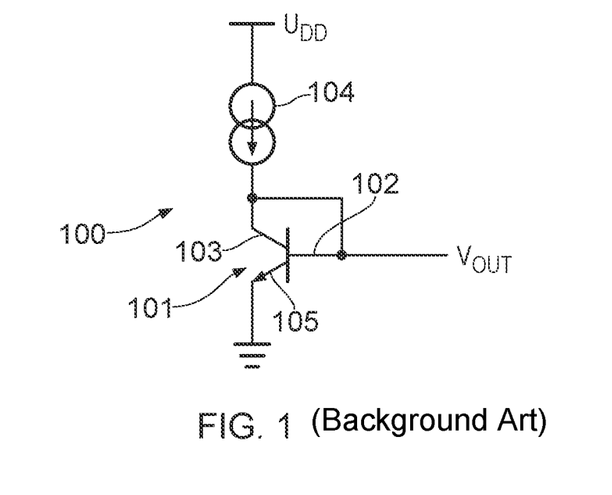
FIG. 1 is a circuit diagram of a base-emitter voltage generator.

FIG. 1 show a circuit 100 which generates a $V_{BE}$ at its output. A bipolar junction transistor (BJT) 101 is arranged in a diode configuration. The base terminal 102 is coupled to the collector terminal 103. The collector is also coupled to a constant current source 104, which is coupled to a positive power rail $V_{DD}$. The emitter terminal 105 is coupled to ground. The base terminal is also coupled to the output of the circuit, $V_{OUT}$. As such, $V_{OUT}$ is the base-emitter voltage, $V_{BE}$, of the BJT 101.

As discussed above, it is well known that $V_{BE}$ is complimentary to absolute temperature (CTAT). In other words, $V_{BE}$ decreases as temperature increases. This relationship is shown in the top chart of FIG. 2. As can be seen, $V_{BE}$ is around 0.75V at room temperature. The sensitivity of the device, $\Delta V/\Delta T$, is around $-1.4$ mV/° C. As can be seen from the bottom chart of FIG. 2, non-linearity is a maximum at around 40° C., and is around 4.2 mV in 700 mV. While this is error is only 0.58%, this represents a temperature error of 3° C., which may be regarded as significant.

Figure 3:
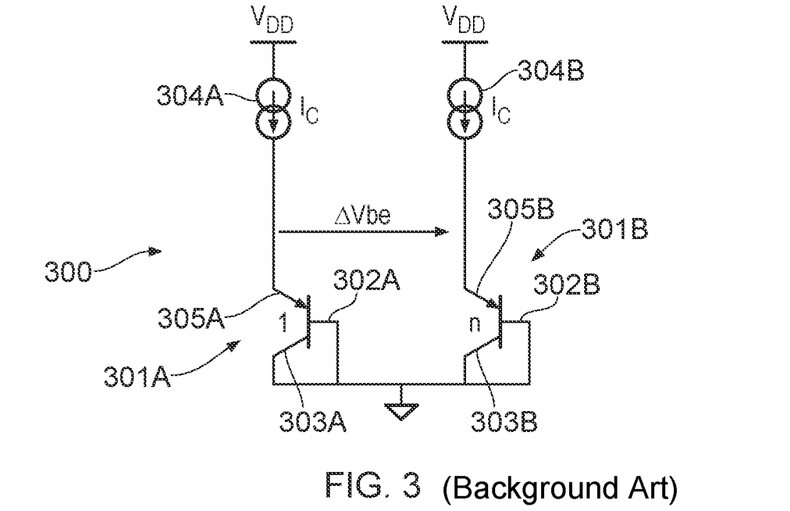
FIG. 3 is a circuit diagram showing a delta base-emitter voltage generator.

FIG. 3 shows a circuit 300 which generates a so-called $\Delta V_{BE}$ output. $\Delta V_{BE}$ circuits use two BJTs in order to output the difference in their $V_{BE}$ values. The output of this arrangement is proportional to absolute temperature (PTAT). In other words, the output voltage increases with temperature. One of the benefits of this arrangement is that the output is also linear, subject to certain design constraints.

The circuit 300 includes two BJTs, 301A and 301B, each arranged in a diode configuration. The base terminals 302A and 302B are both coupled to their respective collector terminals 303A and 303B. The base terminals and collector terminals are also all coupled to ground. The circuit 300 also includes two current sources, 304A and 304B. Each current source is coupled to a respective emitter terminal 305A, 305B of the BJTs. Each current source is also coupled to the positive power rail $V_{DD}$. BJTs 301A and 301B have different emitter areas, in the ratio 1:N.

As is well known in the art, the output of this circuit is given by:

$$\Delta V_{BE}(T) = \frac{kT}{q} \cdot \ln\left(\frac{I_S^{(HCD)}(T)}{I_S^{(LCD)}(T)}\right) \qquad (4)$$

where $I_S$ is the saturation current for the high current density (HCD) and low current density (LCD) BJTs, 301A, 301B. As such, if identical current sources are used, the output of the circuit becomes:

$$\Delta V_{be} = \frac{KT}{q} \ln(n) \qquad (5)$$

Because the current sources have the same temperature dependency, the output is linear, as the argument of the logarithm is constant. To increase sensitivity, different current densities can be used (i.e. 'N' can be changed), but as long as the current sources maintain the same temperature dependence, the output will be linear.

One example of a PTAT circuit known in the art is U.S. Pat. No. 8,531,169 in the name of Analog Devices, Inc. This patent discloses a resistor-less PTAT circuit.

Figure 4:
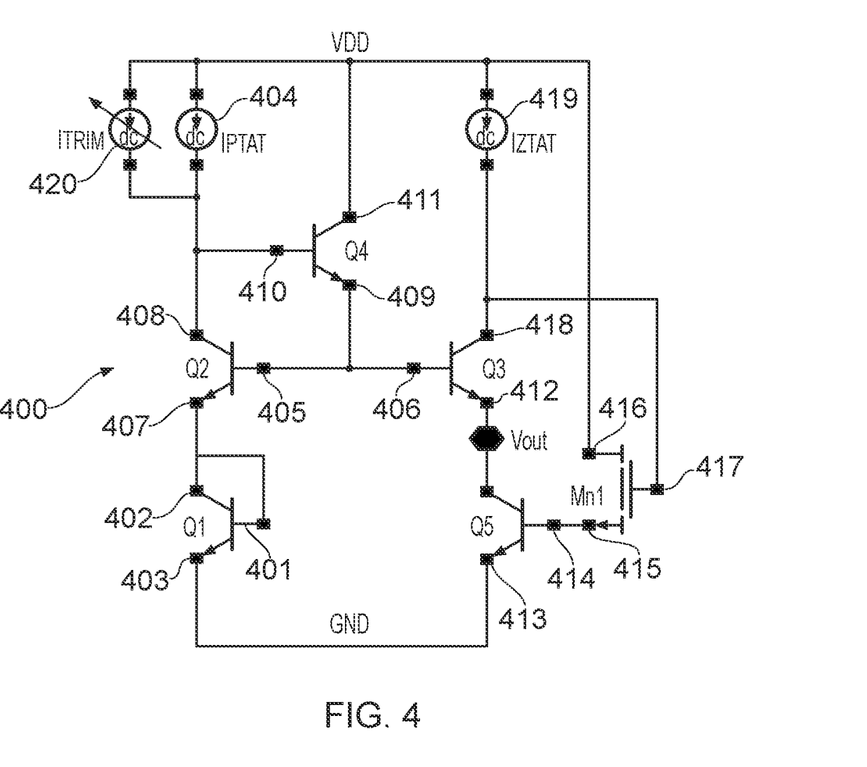
FIG. 4 is a circuit diagram showing a circuit for compensating for non-linearity according to an embodiment of the disclosure.

The present disclosure provides a circuit which produces a CTAT output, based on $V_{BE}$, but with improved non-linearity. FIG. 4 shows a circuit 400 according to a first embodiment. The circuit 400 includes a $V_{BE}$ generator, using BJT Q1, and a $\Delta V_{BE}$ generator, using BJTs Q2 and Q3. The outputs of these circuit components are combined, to produce a CTAT output, with improved, non-linearity at $V_{OUT}$. BJT Q1 is arranged in the usual diode configuration, such that its base terminal 401 is coupled to its collector terminal 402. The emitter terminal 403 is coupled to ground. Q1 is driven by a current source 404 which produces a proportional to absolute temperature (PTAT) current, $I_{PTAT}$. The current source 404 is coupled to the collector terminal 402 of Q1 via BJT Q2, as will be described below. As such, BJT Q1 is configured to produce a $V_{BE}$ output at its collector and base terminals. This output includes the non-linearity component noted above.

As noted above, the $\Delta V_{BE}$ generator is provided by BJTs Q2 and Q3. BJTs Q2 and Q3 have identical emitter areas. The base terminal 405 of Q2 is coupled to the base terminal 406 of Q3. The emitter terminal 407 of Q2 is coupled to the collector terminal 402, and hence the output of the $V_{BE}$ generator. The collector terminal 408 of Q2 is coupled to the $I_{PTAT}$ current source 404. The circuit 400 also include a BJT Q4, which is known as a beta helper, or buffered current mirror configuration, and its function is to supply base current to BJTs Q2 and Q3. As such, the emitter terminal 409 of Q4 is coupled to the base terminals 405, 405 of BJTs Q2 and Q3. The base terminal 410 of Q4 is coupled to the collector terminal 408 of Q2, and to the output of the current source 404. The collector terminal 411 of Q4 is coupled to the positive power rail, $V_{DD}$.

Q3 is configured in an arrangement with a further BJT Q5 and a MOS transistor MN1 to form a nested amplifier, which provides an output at $V_{OUT}$. Specifically, the emitter terminal 412 of Q3 is coupled to $V_{OUT}$, as well as to the collector terminal of Q5. The emitter terminal 413 of Q5 is coupled to ground. The base terminal 414 of Q5 is coupled to the source terminal 415 of MN1. The drain terminal 416 of MN1 is coupled to the positive power rail, $V_{DD}$. The gate terminal 417 of MN1 is coupled to the collector terminal 418 of Q3. The collector terminal 418 of Q3 and the gate terminal 417 of MN1 are both coupled to current source 419, which is an independent to absolute temperature ($I_{ZTAT}$) current source. Current course 419 is also coupled to $V_{DD}$. $V_{OUT}$ is then given by:

$$V_{out} = V_{beQ1} + V_{beQ2} - V_{beQ3} \quad (6)$$

Current source 404 is arranged in parallel with a trimming current source 420 ($I_{TRIM}$). The trimming current source may be any known trimming circuit, which may be implemented using BJTs and MOS devices. The purpose of the trimming source is to increase the bias current, to increase $V_{be}$. Both current sources 404 and 420 are coupled to $V_{DD}$.

The function and operation of the circuit 400 will now be described. As noted above, $V_{BE}$ generator, Q1, is provided with current by $I_{PTAT}$ current source 404. The inventor elected to select a PTAT current source, having considered the impact on non-linearity of using PTAT, CTAT and ZTAT current sources. As noted above, the non-linearity component of $V_{BE}$ is given by Equation 3:

$$nonlin\{V_{BE}(T)\} = XTI\frac{kT}{q}\left[\ln\left(\frac{T}{T_0}\right)\right] + \frac{kT}{q}\ln\left(\frac{I_c}{I_{c0}}\right) \quad (3)$$

For a PTAT current source, the ratio $I_C/I_{C0}$ approximates to the ratio $T/T_0$. As such, Equation 3 becomes:

$$nonlin\{V_{BE}(T)\} = -\frac{kT}{q}\left(XTI\ln\frac{T}{T_0} - \ln\frac{T}{T_0}\right) = -\frac{kT}{q}(XTI-1)\ln\frac{T}{T_0} \quad (7)$$

For a ZTAT current source, the ratio $I_C/I_{C0}$ approximates to 1. As such, Equation 3 becomes:

$$nonlin\{V_{BE}(T)\} = -\frac{kT}{q}\left(XTI\ln\frac{T}{T_0} - \ln 1\right) = -\frac{kT}{q} \cdot XTI - \ln\frac{T}{T_0} \quad (8)$$

For a CTAT current source, Equation 3 becomes:

$$-\frac{kT}{q}\left(XTI\ln\frac{T}{T_0} + \ln\left(\alpha - \frac{T}{T_0}\right)\right) \quad (9)$$

Figure 5:
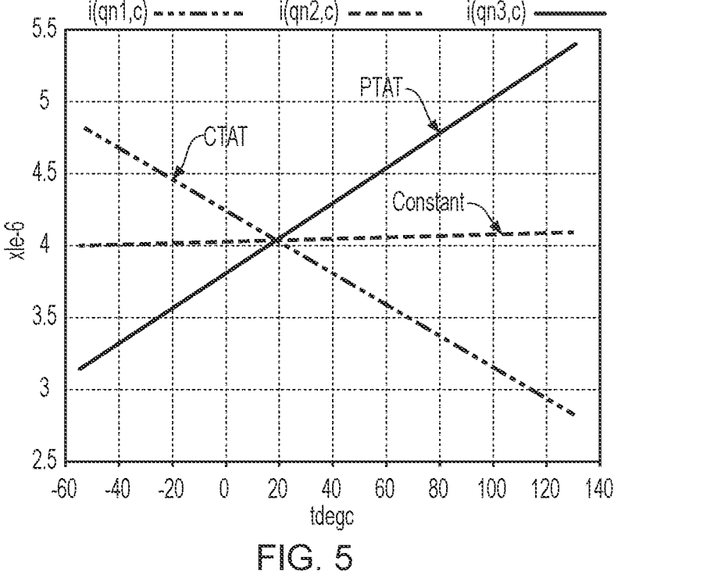
FIG. 5 is a chart showing various bias currents.
Figure 6:
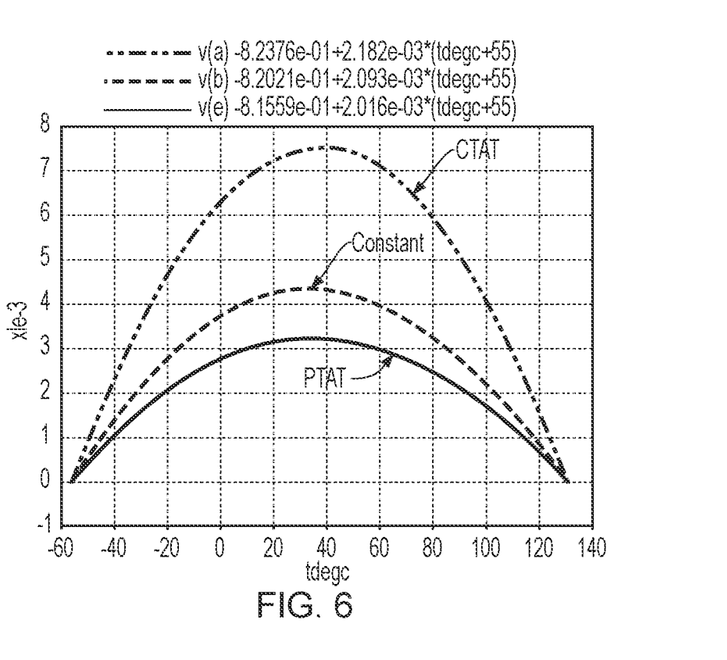
FIG. 6 is a chart showing the impact on the non-linearity of a base-emitter voltage using the currents of FIG. 5.

As can be seen, the PTAT current source shows the greatest improvement in non-linearity. This is shown with the aid of FIGS. 5 and 6. FIG. 5 shows the three different current sources, PTAT, CTAT and ZTAT, and their response to temperature. These currents were then supplied to a BJT, such as the one shown in FIG. 1. FIG. 6 shows the effect of the different current sources on non-linearity in the $V_{BE}$ output. Again, as can be seen, $V_{BE}$ is most linear when the BJT is supplied with a PTAT current source. In view of this, the current source 404 is a PTAT current source.

As noted above, the traditional $\Delta V_{BE}$ PTAT generator shown in FIG. 3 produces a linear output. As such, if the circuit shown in FIG. 3 were to be used in conjunction with a $V_{BE}$ generator, the non-linear component of the $V_{BE}$ output would remain at the overall circuit output. $\Delta V_{BE}$ is given by Equation 4:

$$\Delta V_{BE}(T) = \frac{kT}{q} \cdot \ln\left(\frac{I_S^{(HCD)}(T)}{I_S^{(LCD)}(T)}\right) \quad (4)$$

If current sources with different temperature dependencies are used, a non-linearity may be introduced into $\Delta V_{BE}$. If this is given an opposite sign to that of the non-linearity of $V_{BE}$ (by appropriate arrangement of the $V_{BE}$ and $\Delta V_{BE}$ circuit components), then the non-linearities may be used to cancel each other, at least partially. In particular, if one BJT is provided with a constant current, and one BJT is provided with a PTAT current, $\Delta V_{BE}$ becomes:

$$\Delta V_{BE}(T) = \frac{kT}{q} \cdot \ln\left(\frac{I_S^{(HCD)}(T_0)\frac{T}{T_0}}{I_S^{(LCD)}(T_0)}\right) = \frac{kT}{q}\left(\underbrace{\ln\left(\frac{I_S^{(HCD)}(T_0)}{I_S^{(LCD)}(T_0)}\right)}_{linear} + \ln\left(\frac{T}{T_0}\right)\right) \quad (10)$$

If Equation 10 is subtracted from Equation 7, and if it is assumed that the emitter areas are identical (as per FIG. 4), then the output becomes:

$$V_{out-nonlin} = -\frac{kT}{q}(XTI-1)\ln\frac{T}{T_0} + \frac{kT}{q}\ln\frac{T}{T_0} = -\frac{kT}{q}(XTI-2)\ln\frac{T}{T_0} \quad (11)$$

Figure 7:
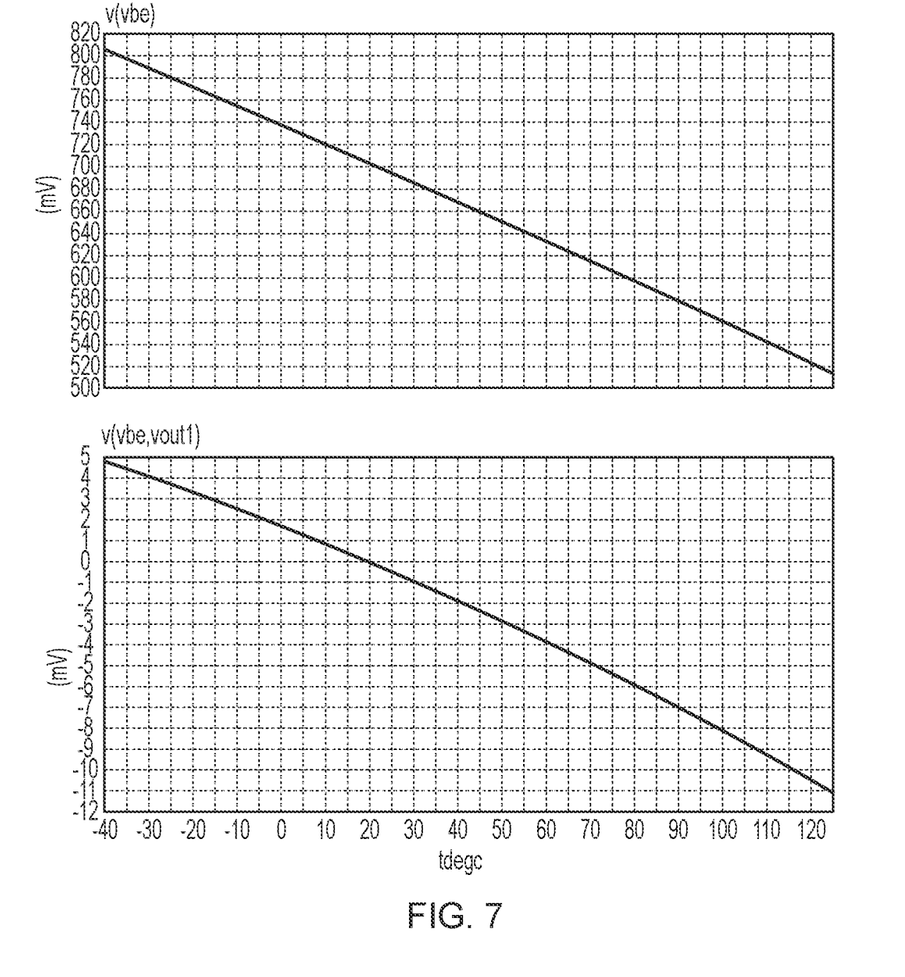
FIG. 7 is a chart showing non-linearity at the output of the circuit of FIG. 4.
Figure 8:
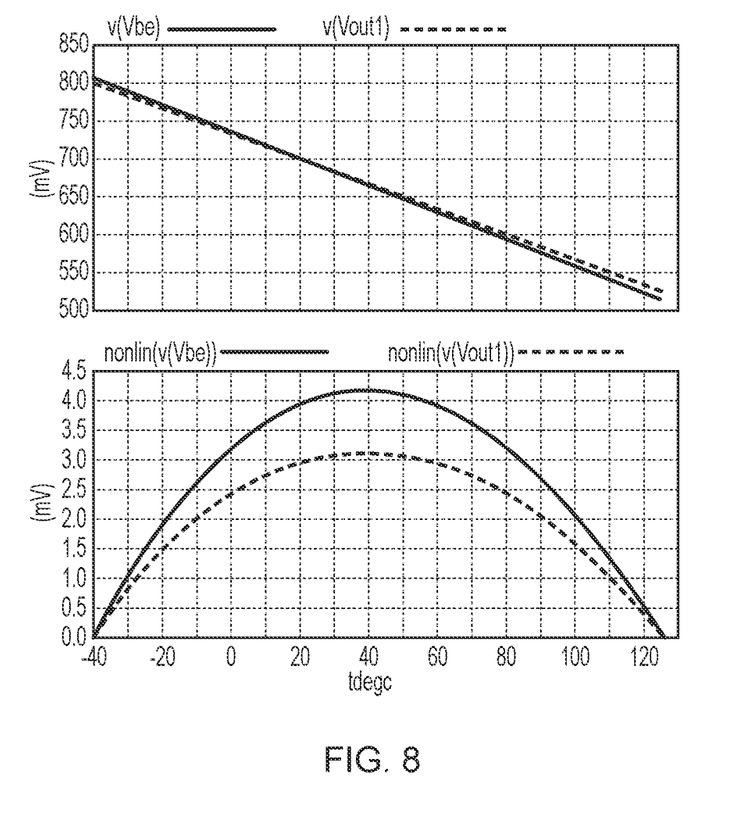
FIG. 8 is a chart showing compensation of non-linearity at the output of the circuit of FIG. 4.

FIG. 7 is a chart showing $V_{BE}$ and $\Delta V_{BE}$ plotted against temperature. FIG. 8 shows how non-linearity is improved. As can be seen, non-linearity improves by around 1 mV, down from 4.2 mV, at 40° C.

Figure 9:
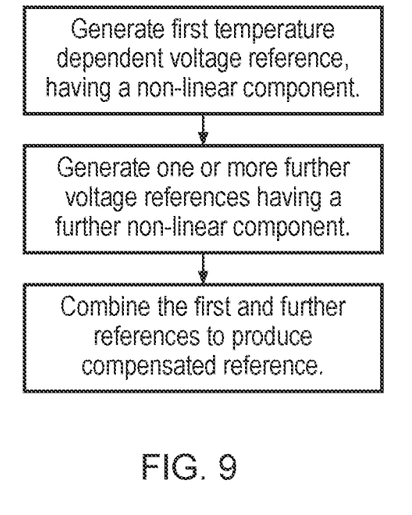
FIG. 9 is a flow chart showing a method of compensating for non-linearity according to an embodiment of the disclosure.

FIG. 9 is a flow chart 900 showing the method of operation of circuit 400. In a first step, a first temperature dependent voltage reference is generated having a first non-linear component (S901). In a second step, one or more further voltage references are generated, each having a further non-linear component (S902). Finally, the first temperature dependent voltage reference is combined with the one or more further voltage references in order to produce a temperature dependent output voltage reference in which the first non-linear component is at least partially compensated (S903).

Figure 10:
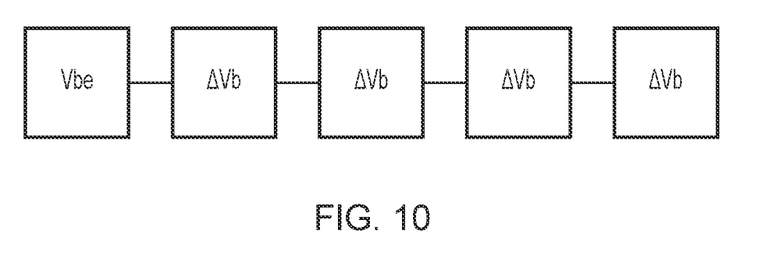
FIG. 10 is a block diagram showing a compensation circuit according to an embodiment of the disclosure.

As will be appreciated form the above, while circuit 400 does improve non-linearity, through the use of a PTAT current source and a $\Delta V_{BE}$ having current sources with different temperature dependencies, non-linearity isn't completely compensated for. FIG. 10 is a block-diagram which shows a principle by which non-linearity may be further compensated.

FIG. 10 shows an arrangement which enables complete, or almost complete, reduction in the non-linearity component. FIG. 10 shows a circuit 1000 for providing an output which is CTAT. The circuit 1000 includes a $V_{BE}$ module 1001, and four $\Delta V_{BE}$ modules 1002A to 1002D. The $V_{BE}$ module 1001, is equivalent to the BJT Q1, and associated components, from FIG. 4. The $\Delta V_{BE}$ modules 1002A to 1002D are equivalent to the BJTs Q2 and Q3, and associated components, from FIG. 4. It will be appreciated that the $V_{BE}$ module and the $\Delta V_{BE}$ modules may be implemented using circuit configurations other than the one shown in FIG. 4. Each of the four $\Delta V_{BE}$ modules provides a non-linearity correction, by introducing non-linearity having a sign opposite to that of $V_{BE}$. The non-linearity introduced by $V_{BE}$ is around 4 mV at 40° C. As each $\Delta V_{BE}$ stage introduces a correction of around 1 mV, the overall output of the arrangement may have the non-linearity component substantially eliminated.

Figure 11:
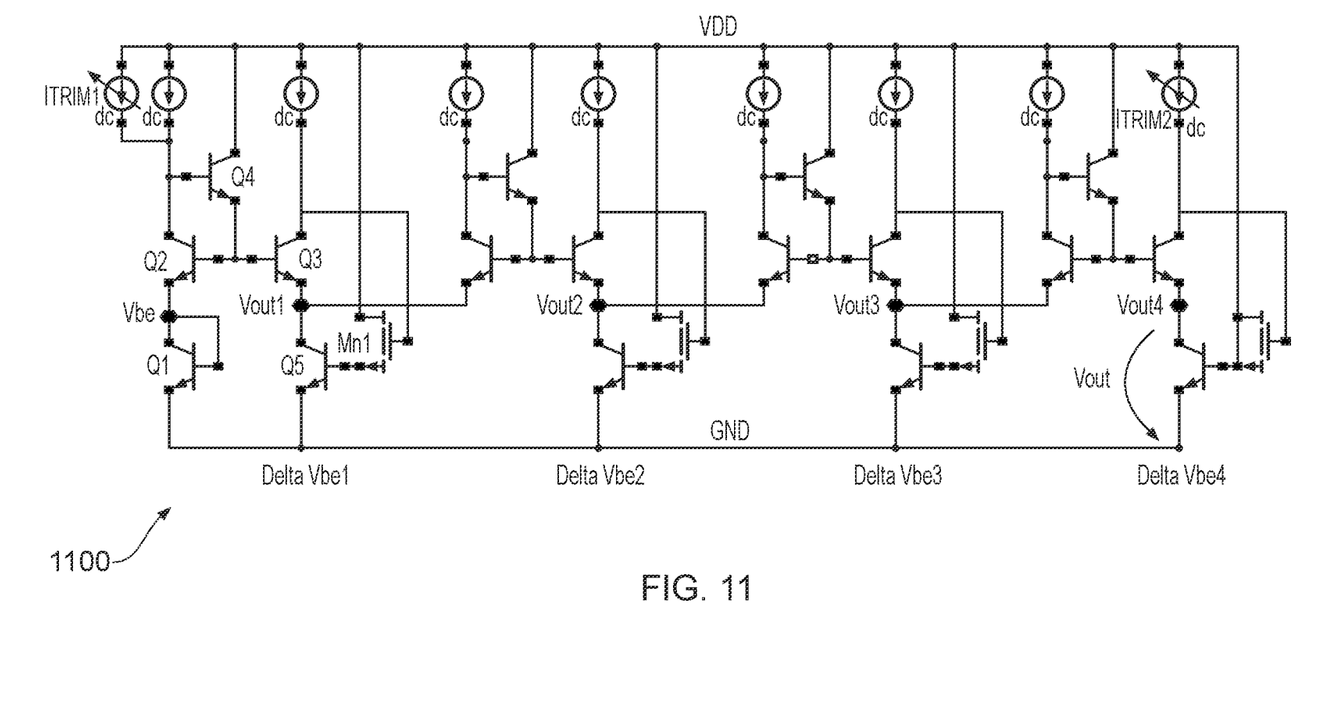
FIG. 11 is a circuit for compensating for non-linearity according to an embodiment of the disclosure.

FIG. 11 shows a circuit 1100 according to a further embodiment. As can be seen, the left-hand side of circuit 1100 is the same as circuit 400. However, three additional $\Delta V_{BE}$ circuits, sharing the same arrangement as the $\Delta V_{BE}$ circuit components from circuit 400, are arranged in a cascaded configuration.

The circuit 1100 includes a $V_{BE}$ generator, using BJT Q1A, and a $\Delta V_{BE}1$ generator, using BJTs Q2A and Q3A. The outputs of these circuit components are combined, to produce a CTAT output, with improved non-linearity at $V_{OUT1}$. BJT Q1A is arranged in the usual diode configuration, such that its base terminal 1101 is coupled to its collector terminal 1102. The emitter terminal 1103 is coupled to ground. Q1A is driven by a current source 1104 which produces a proportional to absolute temperature (PTAT) current, $I_{PTAT1}$. The current source 1104 is coupled to the collector terminal 1102 of Q1A via BJT Q2A, as will be described below. As such, BJT Q1A is configured to produce a $V_{BE}$ output at its collector and base terminals. This output includes the non-linearity component noted above.

As noted above, the $\Delta V_{BE}$ generator is provided by BJTs Q2A and Q3A. BJTs Q2A and Q3A have identical emitter areas. The base terminal 1105 of Q2A is coupled to the base terminal 1106 of Q3A. The emitter terminal 1107 of Q2A is coupled to the collector terminal 1102, and hence the output of the $V_{BE}$ generator. The collector terminal 1108 of Q2A is coupled to the $I_{PTAT1}$ current source 1104. The circuit 1100 also include a BJT Q4A, which is known as a beta helper, and its function is to supply base current to BJTs Q2A and Q3A. As such, the emitter terminal 1109 of Q4A is coupled to the base terminals 1105, 1106 of BJTs Q2A and Q3A. The base terminal 1110 of Q4A is coupled to the collector terminal 1108 of Q2A, and to the output of the current source 11A04. The collector terminal 1111 of Q4A is coupled to the positive power rail, $V_{DD}$.

Q3A is configured in an arrangement with a further BJT Q5A and a MOS transistor MN1A to form a nested amplifier, which provides an output at $V_{OUT1}$. Specifically, the emitter terminal 1112 of Q3A is coupled to $V_{OUT1}$, as well as to the collector terminal of Q5A. The emitter terminal 1113 of Q5A is coupled to ground. The base terminal 1114 of Q5A is coupled to the source terminal 1115 of MN1A. This FET may be an NMOS device. The drain terminal 1116 of MN1A is coupled to the positive power rail, $V_{DD}$. The gate terminal 1117 of MN1A is coupled to the collector terminal 1118 of Q3A. The collector terminal 1118 of Q3A and the gate terminal 1117 of MN1A are both coupled to current source 1119, which is an independent to absolute temperature ($I_{ZTAT}$) current source. Current course 1119 is also coupled to $V_{DD}$. $V_{OUT1}$ is then given by:

$$V_{out1} = V_{beQ1A} + V_{beQ2A} - V_{beQ3A} \quad (12)$$

Current source 1104 is arranged in parallel with a trimming current source 1120 ($I_{TRIM1}$), the operation of which will be described below. Both current sources 1104 and 1120 are coupled to $V_{DD}$.

Three further $\Delta V_{BE}$ circuits are then arranged in a cascaded configuration. Each of these circuits is the same as circuit 400, but with the $V_{BE}$ BJT, Q1, omitted. As such, $V_{OUT1}$ is coupled to the emitter of the first BJT of the $\Delta V_{BE}$ pair. The second $\Delta V_{BE}$ generator is $\Delta V_{BE}2$, and uses BJTs Q2B and Q3B. The outputs of these circuit components are subtracted from $V_{OUT1}$, to produce a further CTAT output, with further improved non-linearity at $V_{OUT2}$.

BJTs Q2B and Q3B have identical emitter areas. The base terminal 1105B of Q2B is coupled to the base terminal 1106B of Q3B. The emitter terminal 1107B of Q2B is coupled to the output of the previous cell, $V_{OUT1}$. The collector terminal 1108B of Q2A is coupled to the $I_{PTAT1}$ current source 1104B. The circuit 1100 also include a BJT Q4B, and the emitter terminal 1109B of Q4B is coupled to the base terminals 1105B, 1106B of BJTs Q2B and Q3B. The base terminal 1110B of Q4B is coupled to the collector terminal 1108B of Q2B, and to the output of the current source 1104B. The collector terminal 1111B of Q4B is coupled to the positive power rail, $V_{DD}$.

Q3B is configured in an arrangement with a further BJT Q5B and a MOS transistor MN1B to form a nested amplifier, which provides an output at $V_{OUT2}$. Specifically, the emitter terminal 1112B of Q3B is coupled to $V_{OUT2}$, as well as to the collector terminal of Q5B. The emitter terminal 1113B of Q5B is coupled to ground. The base terminal 1114B of Q5B is coupled to the source terminal 1115B of MN1B. This FET may be an NMOS device. The drain terminal 1116B of MN1B is coupled to the positive power rail, $V_{DD}$. The gate terminal 1117B of MN1B is coupled to the collector terminal 1118B of Q3B. The collector terminal 1118B of Q3B and the gate terminal 1117B of MN1B are both coupled to current source 1119B, which is an independent to absolute temperature ($I_{ZTAT}$) current source. Current course 1119B is also coupled to $V_{DD}$. $V_{OUT2}$ is then given by:

$$V_{out2}=V_{beQ1A}+V_{beQ2A}-V_{beQ3A}+V_{beQ2B}-V_{beQ3B} \quad (13)$$

Current source 1104B is also coupled to $V_{DD}$.

The third $\Delta V_{BE}$ generator is $\Delta V_{BE}3$, and uses BJTs Q2C and Q3C. The outputs of these circuit components are subtracted from $V_{OUT2}$, to produce a further CTAT output, with further improved non-linearity at $V_{OUT3}$. $\Delta V_{BE}3$ is identical to $\Delta V_{BE}2$.

The components of $\Delta V_{BE}3$ will not be described again here, and are instead identified in FIG. 11 using the suffix 'C'. The output of $\Delta V_{BE}3$ is $V_{OUT3}$. $V_{OUT3}$ is then given by:

$$V_{out3}=V_{beQ1A}+V_{beQ2A}-V_{beQ3A}+V_{beQ2B}-V_{beQ3B}+ \\ V_{beQ2C}-V_{beQ3C} \quad (14)$$

The fourth $\Delta V_{BE}$ generator is $\Delta V_{BE}4$, and uses BJTs Q2D and Q3D. The outputs of these circuit components are subtracted from $V_{OUT3}$, to produce a further CTAT output, with further improved non-linearity at $V_{OUT4}$. $\Delta V_{BE}4$ is identical to $\Delta V_{BE}3$, apart from the current source 1119D, which is a trimmable current source $I_{TRIM2}$. The components of $\Delta V_{BE}4$ will not be described again here, and are instead identified in FIG. 11 using the suffix 'D'. The output of $\Delta V_{BE}4$ is $V_{OUT4}$. $V_{OUT4}$ is then given by:

$$V_{out4}=V_{beQ1A}+V_{beQ2A}-V_{beQ3A}+V_{beQ2B}-V_{beQ3B}+ \\ V_{beQ2C}-V_{beQ3C}+V_{beQ2D}-V_{beQ3D} \quad (15)$$

Figure 12:
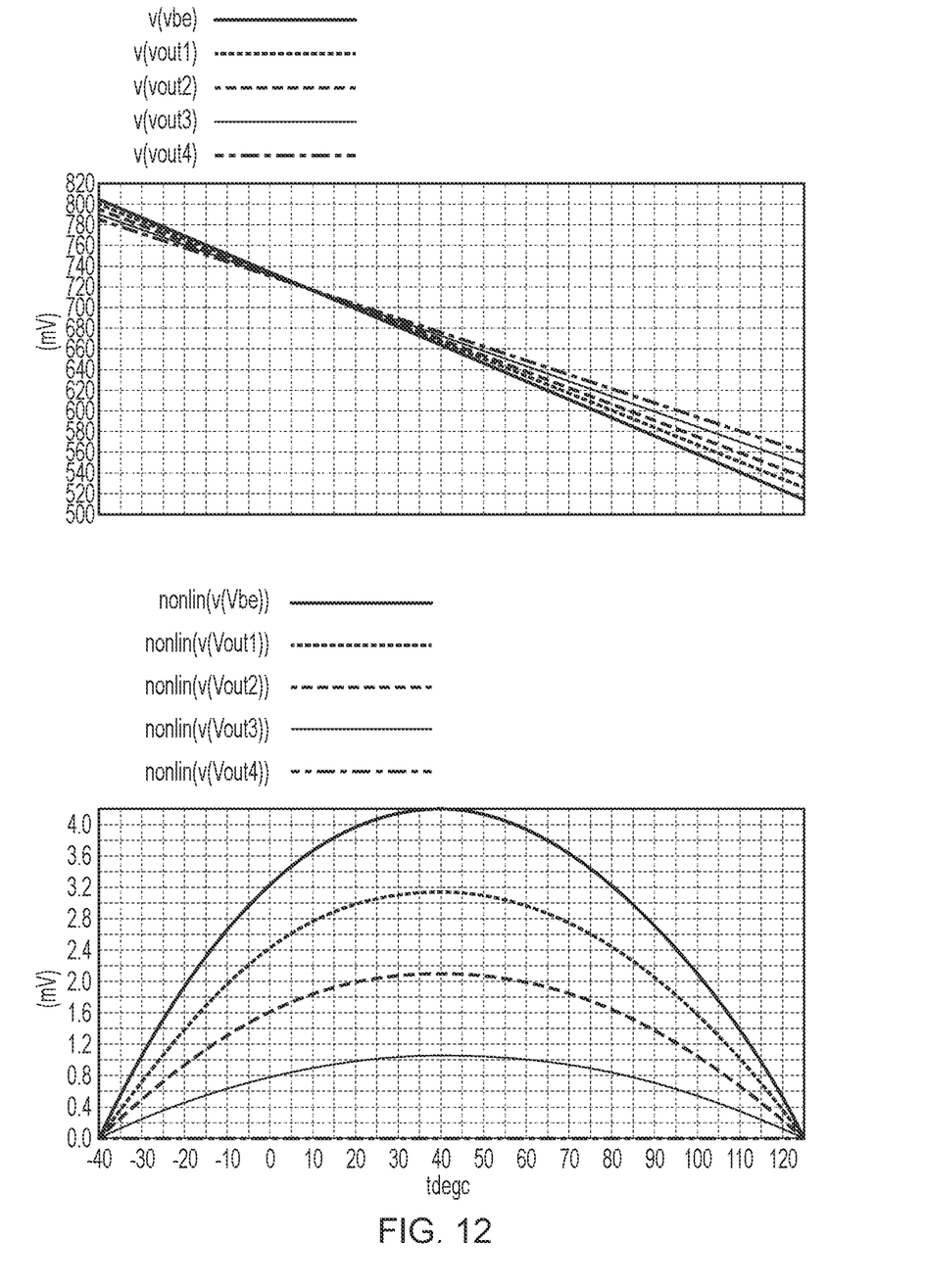
FIG. 12 is a chart showing compensation of non-linearity at the output of the circuit of FIG. 11.

FIG. 12 is a chart showing the outputs of the circuit 1100, at VBE, $V_{OUT1}$, $V_{OUT2}$, $V_{OUT3}$ and $V_{OUT4}$. The top chart shows the output voltage with respect to temperature. The bottom chart shows the output non-linearity with respect to temperature. As can be seen, for each subsequent output, the non-linearity improves by around 1 mV. At $V_{OUT4}$ the non-linearity is substantially, if not completely, eliminated.

Figure 2:
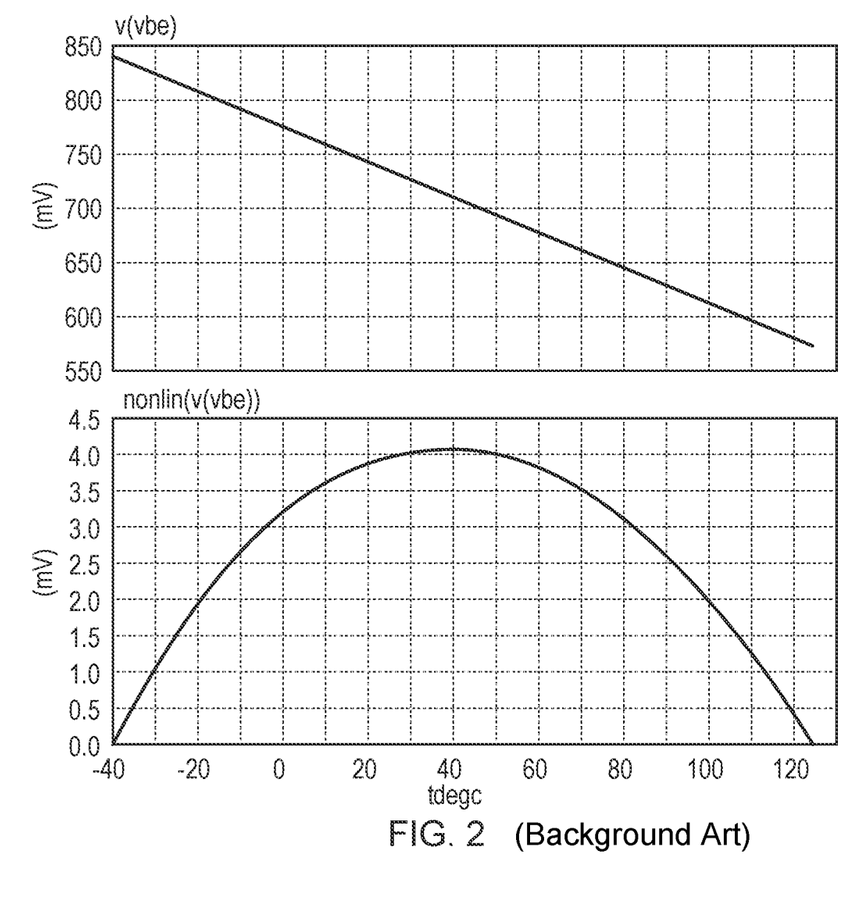
FIG. 2 is a chart showing non-linearity in the output for the circuit of FIG. 1.
Figure 13:
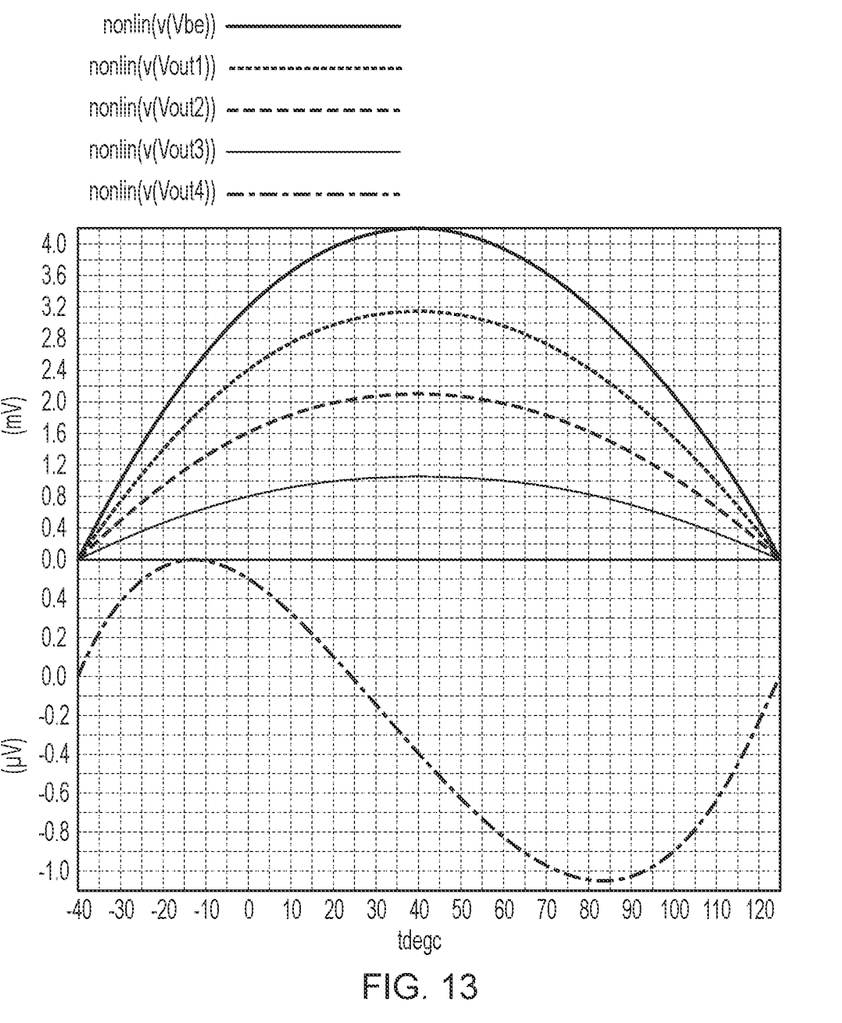
FIG. 13 is a further chart showing compensation of non-linearity at the output of the circuit of FIG. 11.

FIG. 13 is a chart showing the outputs of the circuit 1100. The top chart is the same as the bottom chart of FIG. 12, but is included here for comparison. The bottom chart shows a more detailed view of the non-linearity of $V_{OUT4}$. With the y-axis expanded, it can be seen that there is some minor non-linearity, but it is of the order 2 uV peak-to-peak. This is an improvement of around 2000 times, compared to the non-linearity of an uncompensated BJT. For example, the non-linearity of the BJT shown in FIG. 1 is around 4.2 mV as shown in FIG. 2. The non-linearity of the circuit shown in FIG. 11 is around 2 uV, as shown in FIG. 13.

It should be noted that although in the design described above, four correction cells are required in order to minimise non-linearity, with appropriate selection of bias currents and component values, it would be possible to achieve correction of non-linearity using a single cell. For example, this may be done by changing the behaviour of the ZTAT current source, so that is exhibits CTAT behaviour. However, although full correction may be achieved in absolute terms, a non-linearity of around 600 uV remain. Using multiple correction cells provides much better accuracy, and hence much lower non-linearity.

The above described circuits may be used as a temperature sensor in any embedded or standalone integrated circuit.

In the foregoing, the term "compensate" is used to describe the process of reducing non-linearity. By compensation, it is meant that non-linearity is at least partially compensated for, or alternatively completely compensated for.

The invention claimed is:

1. A circuit for producing a reference output, comprising:
   a base-emitter voltage generator of a reference generation module, configured to generate a first reference output having a first temperature dependent non-linear component; and
   a non-linearity compensation module including a delta base-emitter voltage generator configured to generate a delta base-emitter voltage as a second reference output having a second temperature dependent non-linear component, wherein the delta base-emitter voltage generator is configured to receive a proportional to absolute temperature, PTAT, current and a zero change to absolute temperature, ZTAT, current;
   wherein the base-emitter voltage generator of the reference generation module and the delta base-emitter voltage of the non-linearity compensation module are coupled together such that the first and second reference outputs generate the circuit reference output, and such that the delta base-emitter voltage provides the PTAT current to the base-emitter voltage generator and the second temperature dependent non-linear component at least partially compensates for the first non-linear component.

2. A circuit according to claim 1, wherein the circuit is configured such that the second reference output is subtracted from the first reference output.

3. A circuit according to claim 1, wherein the reference output and the first reference output are complimentary to absolute temperature.

4. A circuit according to claim 1, wherein the reference generation module comprises a first current source, configured to supply the delta base-emitter voltage generator with the PTAT current.

5. A circuit according to claim 4, wherein the base-emitter voltage generator is a first bipolar junction transistor, BJT.

6. A circuit according to claim 5, wherein the delta base-emitter generator comprises a second BJT and a third BJT, wherein the second BJT is coupled to the first current source, such that the second BJT is supplied with the PTAT current and the first BJT receives the PTAT current from the second BJT, and the second module further comprises a second current source, configured to supply the third BJT with the ZTAT current.

7. A circuit according to claim 6, wherein the emitter areas of the second and third BJTs are the same.

8. A circuit according to claim 7, wherein the first BJT is arranged in a diode configuration, and is coupled between the second BJT and ground; the base terminals of the second and third BJTs are coupled together and to a fourth BJT, which is configured to supply a base current to the second and third BJTs.

9. A circuit according to claim 6, wherein the circuit further comprises a MOSFET and a fifth BJT, coupled to the third BJT, and arranged in a nested amplifier configuration to provide the reference output at the output.

10. The circuit of claim 1, in combination with:
    one or more additional non-linearity compensation modules, configured to generate one or more further reference outputs having one or more additional temperature dependent non-linear components;
    wherein the one or more additional non-linearity compensation modules are coupled such that the first, second and one or more further reference outputs generate the circuit reference output, and such that the second temperature dependent non-linear component and the one or more additional temperature dependent non-linear components at least partially compensates for the first non-linear component.

11. A circuit for producing an output which is complimentary to absolute temperature, the circuit comprising:
a base-emitter voltage generator, configured to generate a voltage which is complimentary to absolute temperature, $V_{CTAT}$, and which includes a first non-linear component; and
one or more delta base-emitter voltage generator cells, coupled to the base-emitter voltage generator, and arranged to compensate for the first non-linear component, each cell configured to generate a delta base-emitter voltage having a further non-linear component, wherein the one or more delta base-emitter voltage generator cells each receive a proportional to absolute temperature, PTAT, current and a zero change to absolute temperature, ZTAT, current, and at least one of the one or more delta base-emitter voltage generator cells provide the PTAT current to the base-emitter voltage generator.

12. A circuit according to claim 11, wherein the one or more delta base-emitter voltage generator cells is four cells.

13. The circuit of claim 1, included within a temperature sensor.

14. A method of compensating for non-linearity in a temperature dependent voltage reference, the method comprising:
generating a first temperature dependent voltage reference having a first non-linear component;
generating one or more further voltage references, each having a further non-linear component and configured to receive a proportional to absolute temperature, PTAT, current and a zero change to absolute temperature, ZTAT, current;
combining the first temperature dependent voltage reference with the one or more further voltage references in order provide the PTAT current to the first temperature dependent voltage reference and to produce a temperature dependent output voltage reference in which the first non-linear component is at least partially compensated by the one or more further voltage references.

15. A method according to claim 14, wherein the step of generating a first temperature dependent voltage includes generating a complimentary to absolute temperature reference voltage using the base-emitter junction of a first bipolar transistor.

16. A method according to claim 15, further comprising supplying the collector of the first bipolar transistor with a proportional to absolute temperature current source.

17. A method according to claim 14, wherein the step of generating one or more further reference voltages includes generating one or more delta base-emitter voltages using one or more pairs of bipolar junction transistors.

18. A method according to claim 17, further comprising supplying the collector of one of the pair of BJTs with a proportional to absolute temperature current, and supplying the collector of the other of the pair of BJTs with a current which is substantially independent of absolute temperature.

* * * * *